US011385269B2

(12) United States Patent
Jenkins et al.

(10) Patent No.: US 11,385,269 B2
(45) Date of Patent: Jul. 12, 2022

(54) FREQUENCY SENSOR

(71) Applicant: INL—International Iberian Nanotechnology Laboratory, Braga (PT)

(72) Inventors: Alex Jenkins, Braga (PT); Ricardo Alexandre De Matos Antunes Ferreira, Braga (PT)

(73) Assignee: INL-INTERNATIONAL IBERIAN NANOTECHNOLOGY LABORATORY, Braga (PT)

(*) Notice: Subject to any disclaimer, the term of this patent is extended or adjusted under 35 U.S.C. 154(b) by 214 days.

(21) Appl. No.: 16/767,594

(22) PCT Filed: Nov. 28, 2018

(86) PCT No.: PCT/EP2018/082768
§ 371 (c)(1),
(2) Date: May 28, 2020

(87) PCT Pub. No.: WO2019/105964
PCT Pub. Date: Jun. 6, 2019

(65) Prior Publication Data
US 2020/0326361 A1    Oct. 15, 2020

(30) Foreign Application Priority Data

Nov. 30, 2017   (EP) ..................... 17204583

(51) Int. Cl.
*G01R 23/06*    (2006.01)
*H03B 15/00*    (2006.01)
*G01R 33/09*    (2006.01)
*H01F 10/32*    (2006.01)
*B82Y 25/00*    (2011.01)
*H03B 28/00*    (2006.01)
(Continued)

(52) U.S. Cl.
CPC .............. *G01R 23/06* (2013.01); *B82Y 25/00* (2013.01); *G01R 33/098* (2013.01);
(Continued)

(58) Field of Classification Search
CPC ...... H03B 15/006; H03B 28/00; G01R 23/06; G01R 3/098; H01F 1/0036; H01F 10/329; B82Y 25/00; G11B 2005/3996
(Continued)

(56) References Cited

U.S. PATENT DOCUMENTS

2014/0218122 A1    8/2014   Locatelli et al.

OTHER PUBLICATIONS

Tulapurkaretal , Nature Nov. 17, 2005, Spin torque diode effect in magnetic tunnel junction (Year: 2005).*
(Continued)

Primary Examiner — Arnold M Kinkead
(74) Attorney, Agent, or Firm — Xsensus LLP

(57) ABSTRACT

A frequency sensor is provided. The frequency sensor may include: a magnetoresistive nano-oscillator including a magnetic heterostructure of at least a magnetic free layer, a magnetic reference layer and a non-magnetic intermediate layer arranged between the magnetic free layer and the magnetic reference layer; a coupling arrangement for coupling an incoming signal to at least one magnetic mode of the magnetic free layer, and a frequency estimator. The frequency estimator may be configured to: perform a plurality of voltage measurements across the magnetoresistive nano-oscillator over time; calculate a time averaged voltage across the magnetoresistive nano-oscillator based on the plurality of voltage measurements; estimate, over a finite range of frequencies, a frequency of the incoming signal based on the calculated time averaged voltage, and output a signal representative of the estimated frequency. A method of estimating a frequency of an incoming signal is also provided.

15 Claims, 7 Drawing Sheets

(51) Int. Cl.
  *G11B 5/39* (2006.01)
  *H01F 1/00* (2006.01)
(52) U.S. Cl.
  CPC ......... *H01F 10/329* (2013.01); *H03B 15/006* (2013.01); *H03B 28/00* (2013.01); *G11B 2005/3996* (2013.01); *H01F 1/0036* (2013.01)
(58) Field of Classification Search
  USPC ................. 331/107 T, 157, 107 DP; 73/495; 701/472; 257/421; 335/296; 438/3; 324/76.49
  See application file for complete search history.

(56) References Cited

OTHER PUBLICATIONS

International Search Report and Written Opinion dated Feb. 27, 2019 for PCT/EP2018/082768 filed on Nov. 28, 2018, 12 pages.

Menshawy, S., et al., "Spin transfer driven resonant expulsion of a magnetic vortex core for efficient rf detector," American Institute of Physics Advances, vol. 7, No. 5, Dec. 27, 2016, 4 pages.

Jenkins, A., et al., "A multi-band analogue frequency sensor with sub-MHz resolution based on a Vortex Nano-Oscillator," Retrieved from the Internet URL: https://arxiv.org/ftp/arxiv/papers/1806/1806.06002.pdf, on Feb. 14, 2019, 15 pages.

Jenkins, A., et al., "Spin torque resonant vortex core expulsion for an efficient radio-frequency detection scheme," Retrieved from the Internet URL: arxiv:1505.05358v1 [cond-mat.mes-hall], on May 20, 2015, pp. 1-10.

Extended European Search Report dated Jun. 12, 2018 for 17204583.3 filed on Nov. 30, 2017, 10 pages.

A. S. Jenkins, et al., "Spin-torque resonant expulsion of the vortex core for an efficient radiofrequency detection scheme", Nature Nanotechnology, Published Online: Jan. 4, 2016, 6 pages.

P. Wisniowski, et al., "Magnetic Tunnel Junctions Based on Out-of-Plane Anisotropy Free and In-Plane Pinned Layer Structures for Magnetic Field Sensors", IEEE Transactions On Magnetics, vol. 48, No. 11, Nov. 2012, 3 pages.

\* cited by examiner

FREQUENCY SENSOR

CROSS-REFERENCE TO RELATED APPLICATIONS

The present application is based on PCT filing PCT/EP2018/082768, filed Nov. 28, 2018, which claims priority to EP 17204583.3, filed Nov. 30, 2017, the entire contents of each are incorporated herein by reference.

TECHNICAL FIELD

The present disclosure relates to a frequency sensor. In particular, the present disclosure relates to a frequency sensor including a magnetoresistive nano-oscillator.

BACKGROUND

Signals having frequencies within the frequency range from 50 MHz to 1 GHz are found in various telecommunication applications, including for example US low-band VHF (49-108 MHz), high-band VHF (169-216 MHz), low-band UHF (450-806 MHz) and high-band UHF (900-952 MHz). A non-exhaustive list of devices operating in one or more of these frequency bands includes walkie talkies, wireless microphones, cordless telephones, radio controlled toys, broadcast television, FM radio, land mobile radio/pagers, radio navigational aids, air traffic control, VHF omnidirectional range (VOR) beacons, instrument landing systems (ILS) and 3G mobile networks. These radio bands are used both by private individuals, by businesses and by governmental institutions. In the SHF band (3-30 GHz), potential applications include WiFi, 4G and 5G mobile telecommunications and digital television broadcasting.

For frequency detection and sensing related to such applications and devices, conventional frequency sensors may utilize Schottky diodes and filter banks, or rely on a plurality of frequency detectors coupled together in order to measure frequency over finite intervals.

To meet increasing needs in terms of both frequency sensing capability, bulk size and cost of production, there is a need for improved frequency sensors.

SUMMARY OF THE INVENTION

To at least partly fulfill the above need, the present disclosure seeks to provide at least an improved frequency sensor and an improved method of frequency estimation.

To achieve this, a frequency sensor and a method of estimating a frequency of an incoming signal as defined in the independent claims are provided. Further embodiments of the frequency sensor and the method are provided in the dependent claims.

According to a first aspect, a frequency sensor is provided. The frequency sensor may include a magnetoresistive nano-oscillator. The magnetoresistive nano-oscillator may include a magnetic heterostructure of at least a magnetic free layer, a magnetic reference layer, and a non-magnetic intermediate layer arranged between the magnetic free layer and the magnetic reference layer.

As used herein, a magnetoresistive nano-oscillator may comprise a series of stacked magnetic layers. At least one of the layers may act as the magnetic reference layer, while at least one another layer may act as the magnetic free layer. If coupling is used, more than one layer may act as e.g. a magnetic reference layer (as an example, a synthetic SAF created taking profit of the RKKY intermetallic coupling can be used as a reference layer).

The direction of magnetization of the magnetic free layer may change as a function of time (via for example direct electrical DC excitation or high frequency excitation). The total resistance of the system (i.e. the stack of layers) may be a function of the relative orientation of the direction of magnetization in the magnetic free layer with respect to the direction of magnetization in the magnetic reference layer. This may be achieved for example via a giant magnetoresistance (GMR) effect (in e.g. spin-valves) or via a tunneling magnetoresistance (TMR) effect (in e.g. magnetic tunnel junctions).

As an example, the probability of electrons tunneling across an insulating layer may depend on the relative orientation of the magnetization in the magnetic free layer with respect to the orientation of the magnetization in the magnetic reference layer. If the two orientations of magnetization are parallel, the electron tunneling probability may be increased. If the two orientations of magnetization are not parallel, the electron tunneling probability may be reduced. By controlling the relative orientation of the magnetization in the magnetic free layer and the magnetic reference layer, the tunneling current (and the resistance) across the magnetoresistive nano-oscillator may be controlled. This may be achieved using e.g. one or more applied external magnetic fields.

The frequency sensor may further include a coupling arrangement. The coupling arrangement may be arranged to couple an incoming signal to at least one magnetic mode of the magnetic free layer. A magnetic mode may for example be a spatial mode (i.e. a mode which is present at one or more edges of the magnetic free layer and/or in the middle of the magnetic free layer).

The coupling element may for example include means for running the incoming signal as a current through the magnetoresistive nano-oscillator, thereby coupling the current of the incoming signal to the magnetic mode of the magnetic free layer via various possible mechanisms (such as spin transfer torque or local magnetic fields associated with the electrical current). The coupling element may also for example include means for running the incoming signal in a field line adjacent to the magnetoresistive nano-oscillator, such that the resulting magnetic field generated by the flowing current in the field line couples to the at least one magnetic mode. The coupling arrangement may affect the resistive properties of the magnetoresistive oscillator with the help of the incoming signal, so that properties of the incoming signal may be determined by studying (e.g. by measuring) the behavior of the magnetoresistive nano-oscillator.

The frequency sensor may include a frequency estimator. The frequency estimator may be configured to perform a plurality of voltage measurements across the magnetoresistive nano-oscillator over time. The frequency estimator may be configured to calculate, based on the plurality of voltage measurements, a time averaged voltage across the magnetoresistive nano-oscillator. The frequency estimator may be configured to estimate, over a finite range of frequencies, a frequency of the incoming signal based on the calculated time averaged voltage.

A time averaged voltage may be calculated by, for example, summing all values obtained from the plurality of voltage measurements over time, and then dividing this sum by the number of voltage measurement values. If the plurality of voltage measurements may be treated as a continuous signal, the time averaged voltage may be calculated by integrating the voltage signal over a certain time interval, and then dividing the value of this integral with the length of the certain time interval. It may also be envisaged that the sum, or integral, is not divided by the number of values or by the length of the certain time interval, and that the time averaged voltage then obtained is only proportional to the "true" averaged voltage.

The frequency estimator may also be configured to output a signal representative of the estimated frequency. The signal may for example be an electric signal or an electromagnetic signal, and the information about the estimated frequency may be encoded in the signal using an analog or a digital method. The signal may represent directly the estimated frequency, or contain enough information for the estimated frequency to be derived therefrom.

A conventional threshold frequency detector may provide information only about whether a specific frequency component is in the input signal or not, to within a specific bandwidth. Phrased differently, the conventional frequency detector uses a single voltage measurement across the magnetoresistive nano-oscillator and answers the question "is the frequency of the incoming signal the frequency X?" with either "yes" or "no". To be able to answer the broader question "what is the frequency X of the signal?", multiple such threshold frequency detectors may be constructed and operated together, where each detector j is tuned to a specific frequency $X_j$ e.g. by changing the diameter/extension of the magnetic free layer and/or the thickness of the magnetic free layer of the respective detector. By analyzing the outputs from the detectors, i.e. by asking each detector j the question "is the frequency of the signal the frequency $X_j$?" and by studying the answers, at least some information about what the frequency of the signal is may be obtained. The precision of the answer may for example be limited by the number of threshold detectors used.

The frequency sensor in accordance with the present disclosure may, however, cover a finite range of frequencies using a single device. By performing a plurality of voltage measurements across the magnetoresistive nano-oscillator over time, and by calculating a time averaged voltage, the frequency sensor may rely on the probabilistic nature of certain events associated with at least one magnetic mode of the magnetic free layer. The probability of a certain event, related to the at least one magnetic mode, may depend upon the frequency of the incoming signal which is used to couple to the at least one magnetic mode. The measured voltage across the magnetoresistive nano-oscillator may depend on such probability, and the time averaged voltage may therefore be indicative of the frequency of the incoming signal.

Phrased differently, estimating the probability of the certain event related to the at least one magnetic mode may allow for the frequency sensor of the present disclosure to answer the broader question "what is the frequency X of the signal?" using a single magnetoresistive nano-oscillator and device.

As only a single magnetoresistive nano-oscillator and device is required, the number of interconnects, overall size, circuit complexity, and e.g. power consumption, of the frequency sensor according to the present disclosure may be reduced compared to a conventional system of multiple threshold frequency detectors needed to answer the same question. The frequency sensor according to the present disclosure may also have smaller dimensions, operate at higher frequencies and have smaller power consumption compared to conventional frequency sensors such as those based on a charge pump and the charging and discharging of capacitors.

In some embodiments, the frequency estimator may be configured to estimate the frequency of the incoming signal as a one-to-one function of the calculated time averaged voltage. Herein, a "one-to-one function" may be defined as a function where for each element of the range of the function, the function corresponds to exactly one element of the domain of the function. The function may for example be a linear function, a logarithmic function, an exponential function, or similar. If assuming a linear one-to-one function, the frequency of the incoming signal may for example be determined as the calculated time average voltage multiplied with a proportionality constant, plus a constant which may be zero.

It may be envisaged that the behavior (or state) of the magnetoresistive nano-oscillator (i.e., the "system") may be divided into one or more deterministic regions and at least one probabilistic region with regards to the frequency of the incoming signal. In each of the at least one or more deterministic regions, the state of the system (e.g. its magnetization) may not depend on time and if, at a certain moment in time, the system is found to be in a specific state it will remain there until e.g. the frequency of the incoming signal is changed. In the at least one probabilistic region, the system may change between two or more states and the probability of finding the system in either state may depend on the frequency of the incoming signal. The at least one or more deterministic regions may for example correspond to lower and/or higher frequencies of the incoming signal. The at least one probabilistic region may for example correspond to the frequencies in between these lower and higher frequencies which correspond to the at least one or more deterministic regions.

The frequency estimator may for example be configured to estimate the frequency of the incoming signal as a one-to-one function of the calculated time averaged voltage for frequencies in the at least one probabilistic region.

More details concerning the different regions will be given later herein in the detailed description section, with reference to one or more embodiments.

In some embodiments, the magnetoresistive nano-oscillator may be a magnetic tunnel junction (MTJ). The MTJ may be configurable in a state which has at least one magnetic vortex core. The state containing the at least one magnetic vortex core may for example be a ground state of the magnetic free layer and the MTJ.

A magnetic vortex core may be part of a magnetic vortex. The magnetic vortex core may be defined e.g. as the central out-of-plane component of the magnetic vortex, where the plane is defined by the major plane of extension of the magnetic free layer. If excited by a current and/or magnetic field, the magnetic vortex core may move around within the plane, e.g. in a circular or approximately circular trajectory, leading to an oscillatory motion of the core. Such an oscillatory mode may be referred to as a gyrotropic mode. The at least one magnetic mode of the magnetic free layer may include the gyrotropic mode of the magnetic vortex core. The at least one magnetic mode of the magnetic free layer may for example also, or instead, include spin wave modes associated with the in-plane magnetization component of the vortex, and/or radial breathing modes associated with the vortex core.

The coupling arrangement may include at least one field line adjacent to the MTJ for passing the incoming signal through as current to generate a magnetic field (i.e. a field generated by the flowing incoming signal current). The generated magnetic field may be usable to excite the at least one gyrotropic mode of the magnetic vortex core using the incoming signal.

The radius of the trajectory in the gyrotropic mode may depend on the incoming frequency of a signal which is used to excite the magnetic vortex core via the coupling arrangement. This oscillation may be sufficiently large (i.e. have a sufficiently large radius) for the magnetic vortex core to approach the perimeter of the magnetic free layer in the plane. When this occurs, the magnetic vortex core may interact with the perimeter (or edge) and annihilate. As a result, the magnetic vortex core may be expelled, and the magnetization of the magnetic free layer may return to a state which is essentially uniform. Due to the tunneling magnetoresistance effect, there may be an associated change of resistance across the MTJ between the uniform state and the vortex state. After a vortex core is expelled, a new vortex core may renucleate, and the resistance across the MTJ may oscillate. This oscillation may be reflected in the measured voltage across the MTJ.

By performing a plurality of voltage measurements across the MTJ over time, the frequency estimator may estimate a probability of the at least one magnetic vortex core being expelled by reaching a perimeter of the magnetic free layer. The probability may be reflected in the calculated time averaged voltage.

For the magnetic vortex core to be expelled (e.g. by having a radius of oscillation large enough for the magnetic vortex core to reach the edge of the magnetic free layer), it may be required that the frequency of the incoming signal is not too different from one or more resonant frequencies of the magnetic vortex core. Mapped on the different regions as defined above, a first (and second) deterministic region may correspond to frequencies of the incoming signal being low (or high) enough to make the absolute difference between the incoming frequency and one or more resonant frequencies of the magnetic vortex core too large and to thereby prohibit the large gyrotropic orbits necessary for expulsion to occur. The probability of the magnetic vortex core being expelled may thus be low or zero, and the system may with high probability or always be found in a vortex state. Even though such a vortex state may oscillate (i.e. the magnetic vortex core may move around within the magnetic free layer), the magnetization of the magnetic free layer may remain unchanged. As a result, the calculated time averaged voltage may be independent of the frequency of the incoming signal in these deterministic regions.

In between the first deterministic region and the second deterministic region, the absolute difference between the frequency of the incoming signal and one or more resonant frequencies of the magnetic vortex core may be small enough for the magnetic vortex core to be at least occasionally expelled from the magnetic free layer. Within this probabilistic region, probability of the vortex core state being expelled may depend on the frequency of the incoming signal, and the calculated time averaged voltage may correspond to the frequency of the incoming signal in a one-to-one way (as described earlier herein).

In some embodiments, the frequency estimator may be configured to perform the voltage measurements over a time interval spanning several oscillations of the at least one magnetic core. Performing the voltage measurements over several oscillations may e.g. improve the accuracy when estimating the voltage (or probability) and the frequency. A single, "instantaneous" voltage value may not be unique to a specific frequency. Instead, the frequency estimator may use the time averaged value in order to estimate the voltage (or probability) and the frequency with improved accuracy.

In some embodiments, the at least one magnetic mode may include an azimuthal spin wave mode and/or a radial breathing mode of the magnetic free layer. The gyrotropic mode of the magnetic vortex core may be excited indirectly through the azimuthal spin wave mode and/or the radial breathing mode. By not exciting the gyrotropic mode directly, but indirectly through a coupling via a higher order mode (e.g. the azimuthal spin wave mode and/or the radial breathing mode), the frequency sensor may operate at higher frequencies. It may be envisaged to operate the frequency sensor at least up to 10 GHz or more.

In some embodiments, the magnetoresistive nano-oscillator may be an MTJ. The coupling arrangement may include at least one conductor for passing the incoming signal as current through the MTJ. Passing the incoming signal as current through the MTJ may modulate the magnetization in the magnetic free layer. This may be achieved e.g. via spin transfer torque and/or a magnetic field induced by the current.

For an incoming signal having a finite frequency, the current may cause the magnetization in the free magnetic layer to oscillate (i.e. it is modulated by the incoming signal current). This may result in the resistance of the MTJ changing as a function of time. Mixing between this resistance and the incoming signal current may cause a rectified voltage across the MTJ. This may be similar to a spin-diode effect, but based on modulation effect rather than on a resonance excitation which makes the effect available for a larger range of frequencies. This rectified voltage may be saturated for low-frequency signals in a deterministic way (i.e. with high or unit probability, and corresponding to the first, deterministic region as referred to above). When the input signal frequency exceeds the amplitude relaxation rate of the MTJ and the magnetic free layer, the frequency sensor may no longer respond to the incoming signal current. Without the modulation, no rectified voltage may be available and the voltage measured across the MTJ may approach a lower value which may be zero in a deterministic way (i.e. with high or unit probability, corresponding to the second, deterministic region as referred to above). Between the first and second deterministic regions, the rectified voltage may be reduced as a function of increasing frequency in a probabilistic way. In this region (i.e. corresponding to the third, probabilistic region as referred to above), the calculated time average (rectified) voltage may change with a probability depending on the frequency of the incoming signal.

Phrased differently, the voltage across the magnetoresistive nano-oscillator may depend on whether the system is "locked" to the incoming modulation signal (i.e. the incoming signal current) or not. The probability of locking may depend on the frequency of the incoming signal, and the probability may be obtained from the calculated time averaged voltage. The calculated time averaged voltage may thereby give information about the frequency. The relationship between this probability and the frequency may correspond to a one-to-one function, and e.g. have a logarithmic dependency.

In some embodiments, a magnetization of the magnetic free layer may be tilted out of the plane of the MTJ. The out of plane tilting may be achieved due to for example a surface anisotropy between an interface between the non-magnetic intermediate layer and the magnetic free layer. The out of plane tilting may be achieved also due to e.g. alloys of CoPt multilayers. Tilting the magnetization of the magnetic free layer out of plane of the MTJ may make the desired effect larger, thereby providing an improved sensor.

In some embodiments, the frequency estimator may be configured to perform the voltage measurements over a time interval spanning several periods of the incoming signal. As an example, if a frequency of the incoming signal is 1 MHz, the frequency estimator may be configured to perform the voltage measurements over a time interval spanning several microseconds. Similarly, if a frequency of the incoming signal is 100 MHz, the voltage measurements may be performed over a time interval spanning several tenths of nanoseconds.

In some embodiments, the frequency estimator may be configured to determine a required length of the time interval (during which the plurality of voltage measurements are performed) based on a desired resolution of the determined frequency of the incoming signal. For example, a higher desired resolution of the determined frequency may require the length of the time interval to be longer. Likewise, if the desired resolution of the determined frequency is lower, the length of the time interval may be reduced.

In some embodiments, the frequency estimator may be configured to measure the voltage across said magnetoresitive nano-oscillator as a rectified voltage. This may include taking the absolute values of the measured voltages before calculating the time averaged voltage.

In some embodiments, the frequency sensor may further include a biasing arrangement. The biasing arrangement may provide a biasing DC current through the magnetoresitive nano-oscillator. For a fixed biasing DC current, a change in resistance across the magnetoresistive nano-oscillator may then be detected as a change in a voltage measured across the magnetoresistive nano-oscillator.

In some embodiments, the magnetoresistive nano-oscillator may be provided in form of a nanopillar.

According to a second aspect of the present disclosure, a method of estimating a frequency of an incoming signal is provided.

The method may include coupling the incoming signal to at least one magnetic mode of a free magnetic layer, the free magnetic layer forming part of a magnetoresistive nano-oscillator including a magnetic heterostructure of at least the magnetic free layer, a magnetic reference layer and a non-magnetic intermediate layer arranged between the magnetic free layer and the magnetic reference layer. The method may include performing a plurality of voltage measurements across the magnetoresitive nano-oscillator over time. The method may include calculating, based on the plurality of voltage measurements, a time averaged voltage across the magnetoresitive nano-oscillator. The method may further include estimating, over a finite range of frequencies, a frequency of the incoming signal based on the calculated time averaged voltage. The method may further include outputting a signal representative of the estimated frequency.

Details and advantages of the method according to the second aspect may be found in the earlier discussion of the details and advantages of the frequency sensor according to the first aspect.

In some embodiments, the method may include estimating the frequency of the incoming signal as a one-to-one function of the calculated time averaged voltage across the magnetoresitive nano-oscillator.

In some embodiments, the method may include providing the magnetoresistive nano-oscillator as a magnetic tunnel junction (MTJ). The magnetic free layer may be configured in a state having at least one magnetic vortex core. The at least one magnetic mode may include a gyrotropic mode of the magnetic vortex core. The coupling of the incoming signal to the at least one magnetic mode may be achieved by passing the incoming signal as a current through at least one field line adjacent to the MTJ to generate a magnetic field. The magnetic field may be useable to excite the at least one gyrotropic mode of the magnetic vortex core using the incoming signal.

In some embodiments, the plurality of voltage measurements may be performed over a time interval spanning several oscillations of the at least one magnetic vortex core.

In some embodiments, the at least one magnetic mode may include an azimuthal spin wave mode. The gyrotropic mode of the magnetic vortex core may be excited indirectly through the azimuthal spin wave mode. In some embodiments, the at least one magnetic mode may include also, or instead, a radial breathing mode. The gyrotropic mode of the magnetic vortex core may be excited indirectly through the radial breathing mode.

In some embodiments, the magnetoresistive nano-oscillator may be a magnetic tunnel junction (MTJ). The coupling of the incoming signal to the at least one magnetic mode may be achieved by passing the incoming signal as a current through the MTJ. Passing the current through the MTJ may modulate a magnetization in the magnetic free layer.

In some embodiments, the method may include tilting a magnetization of the magnetic free layer out of the plane of the MTJ.

In some embodiments, estimating the frequency of the incoming signal may include performing the voltage measurements of a time interval spanning several periods of the incoming signal.

In some embodiments, the method may include determining a required length of the time interval based on a desired resolution of the determined frequency of the incoming signal.

In some embodiments, the method may include measuring the voltage across the magnetoresistive nano-oscillator as a rectified voltage.

In some embodiments, the method may include providing a biasing DC current through the magnetoresistive nano-oscillator.

In some embodiments, the method may include providing the magnetoresistive nano-oscillator in the form of a nanopillar.

The present disclosure relates to all possible combinations of features mentioned herein, including the ones listed above as well as other features which will be described in what follows with reference to different embodiments.

Herein, any advantages and/or details explained with reference to embodiments of the frequency sensor of first aspect apply also to corresponding embodiments of the method of the second aspect, and vice versa.

Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which:

FIG. 5b illustrates data related to the magnetoresistive nano-oscillator as illustrated in FIG. 5a;

Figure 1A:
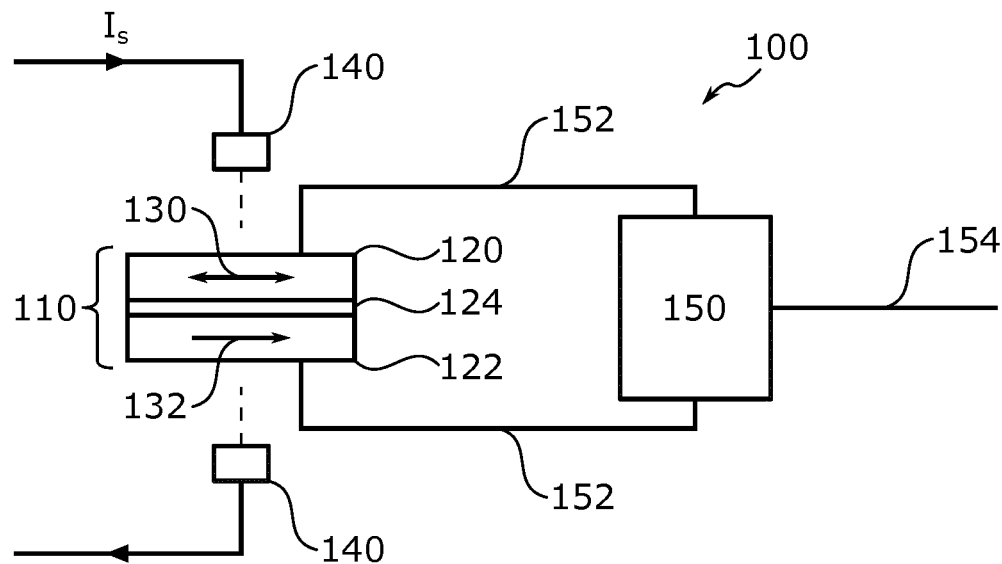
FIGS. 1a-1c illustrate schematically embodiments of a frequency sensor according to the present disclosure.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Exemplifying embodiments will now be described more fully hereinafter with reference to the figures of the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person.

Figure 1B:
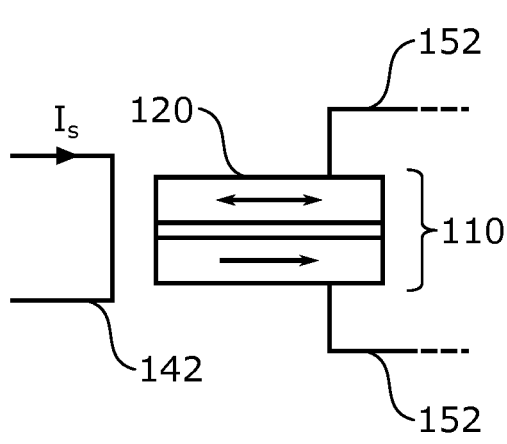
Figure 1C:
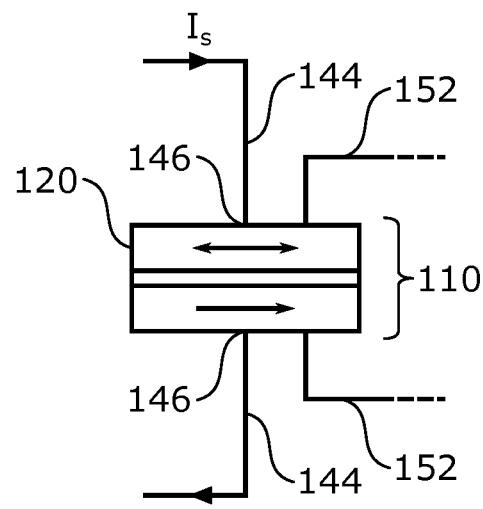

With reference to FIGS. 1a-1c, an embodiment of a frequency sensor according to the present disclosure will now be described in more detail.

FIG. 1a illustrates schematically a frequency sensor 100. The frequency sensor 100 includes a magnetoresistive nano-oscillator 110. The magnetoresistive nano-oscillator 110 is formed by a magnetic free layer 120, a magnetic reference layer 122 and a non-magnetic intermediate layer 124. The intermediate layer 124 is arranged between the free layer 120 and the reference layer 122. The magnetization in the free layer 120 is not fixed to any particular direction, but may be influenced e.g. by an applied field or an electric current passing through the magnetoresistive nano-oscillator 110. In FIG. 1a, the magnetization of the free layer is illustrated by the double-headed arrow 130. The magnetization of the reference layer 122 is fixed, as illustrated by the single-headed arrow 132.

Herein, although illustrated as single layers, it is envisaged that, in embodiments of the frequency sensor according to the present disclosure, one or more of the free layer 120 and/or the reference layer 122 may be formed by stacking several layers together. For example, the reference layer 122 may include more than one layer, and the materials of each layer in the reference layer 122 may be different, if necessary. The same applies to the free layer 120, and also to the intermediate layer 124.

The frequency sensor 100 also includes a coupling arrangement 140. The coupling arrangement 140 couples the incoming signal (illustrated as a current Is) to at least one magnetic mode of the magnetic free layer 120. This may occur for example by the coupling arrangement 140 allowing for the current Is to pass through the magnetoresistive nano-oscillator, or for example by the coupling arrangement 140 allowing for the current Is to pass through a field line adjacent to the magnetoresistive nano-oscillator 110 such that the magnetic field created by the current Is may influence the magnetoresistive nano-oscillator 110 and the free layer 120.

The frequency sensor 100 also includes a frequency estimator 150, which is attached across the magnetoresistive nano-oscillator 110 using wires 152. The frequency estimator 150 may perform a plurality of voltage measurements across the magnetoresistive nano-oscillator 110 over time. Based on the values of the plurality of voltage measurements, the frequency estimator 150 may calculate a time averaged voltage. The frequency estimator 150 may then, based on the calculated time averaged voltage, estimate the frequency of the incoming signal Is. The frequency estimator 150 outputs a signal which is representative of the estimated frequency. The signal is output on a wire 154.

The frequency estimator 150 may include a voltage meter for performing the plurality of voltage measurements across the magnetoresistive nano-oscillator 110 over time. The voltage meter may preferably be a digital voltage meter, including functionality to record the measured voltages as a time series in some memory available either in or to the frequency estimator 150. It is envisaged that also an analog voltage meter may be used, if necessary. The frequency estimator 150 may further include one or more computational devices, in the form of for example one or more processors, microprocessors, FPGAs, or similar, such that a time averaged voltage may be calculated based on the stored voltage measurement values. The same, or similar, computational devices may then also be used to estimate the frequency of the incoming signal and to generate the output signal on the wire 154.

Although illustrated as a physical wire, the wire 154 may also be envisaged as being a radio- or optical link, such that the estimated frequency, or a signal indicative of the estimated frequency, may be output wirelessly.

FIG. 1b illustrates an embodiment of the frequency sensor 100 in which the coupling arrangement 140 includes a field line 142. The field line 142 is arranged adjacent to the magnetoresistive nano-oscillator 110, such that the incoming signal (in form of the current Is) may be passed through the field line 142. When passing the current Is through the field line 142, the thereby generated magnetic field may couple the incoming signal to the at least one magnetic mode in the free layer 120 of the magnetoresistive nano-oscillator 110. The magnetic field felt by the magnetoresistive nano-oscillator 110 may depend on the distance between the field line 142 and the magnetoresistive nano-oscillator 110. The field felt by the magnetoresistive nano-oscillator 110 may therefore be adjusted as required by moving the field line 142 closer to (or further away from) the magnetoresistive nano-oscillator 110.

FIG. 1c illustrates an embodiment of the frequency sensor 100 in which the coupling arrangement 140 includes wires 144 connected to the magnetoresistive nano-oscillator 110 using electrodes 146. Using the wires 144, the incoming signal may be passed as the current Is through the magnetoresistive nano-oscillator 110. When passing the current Is through the magnetoresistive nano-oscillator 110, the current may couple the incoming signal to the at least one magnetic mode in the free layer 120 of the magnetoresistive nano-oscillator.

Figure 2A:
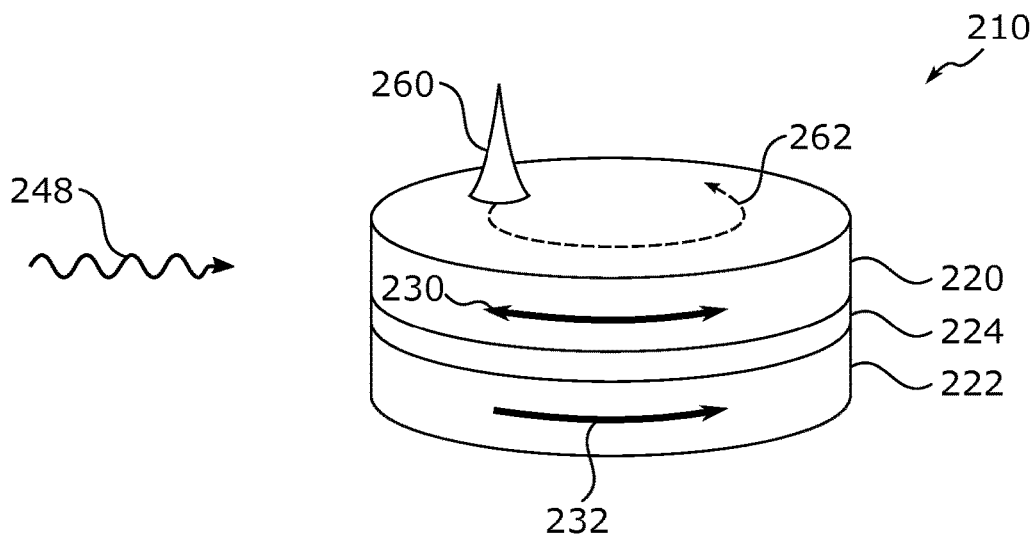
FIGS. 2a-2b illustrate schematically embodiments of a magnetoresistive nano-oscillator of a frequency sensor according to the present disclosure.
Figure 2B:
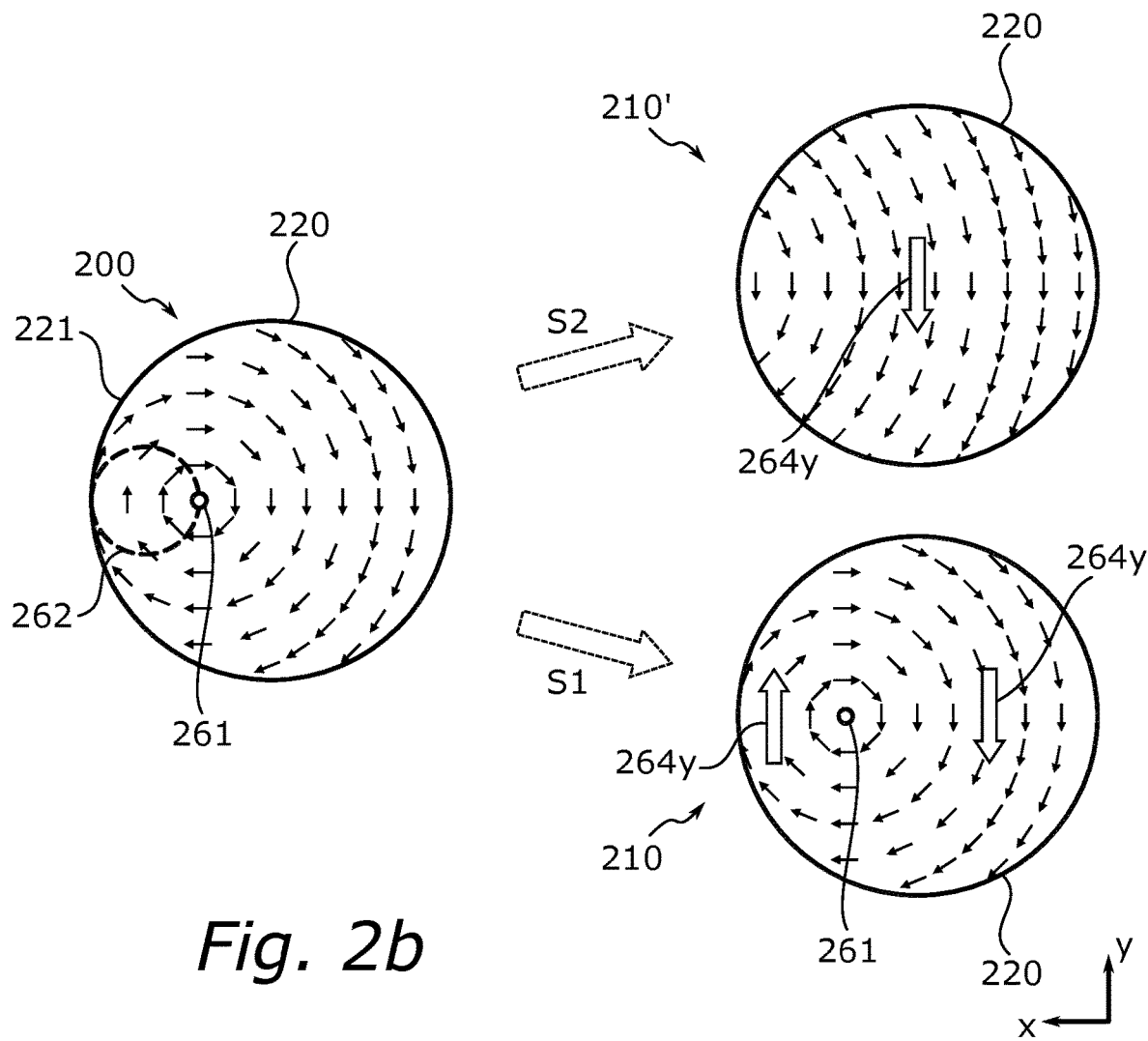

With reference to FIGS. 2a and 2b, one embodiment of a magnetoresistive nano-oscillator of a frequency sensor according to the present disclosure will be described in more detail.

FIG. 2a illustrates a magnetoresistive nano-oscillator 210 of a frequency sensor. The magnetoresistive nano-oscillator 210 may be used as the magnetoresistive nano-oscillator 110 shown for examples in FIGS. 1a and 1b. The magnetoresistive nano-oscillator 210 is a magnetic tunnel junction (MTJ) and is fabricated as a nano-pillar. The MTJ 210 includes a magnetic free layer 220, a magnetic reference layer 222, and a non-magnetic intermediate layer 224 which is arranged between the free layer 220 and the reference layer 224. As described earlier, the magnetization of the free layer 220 (illustrated by the double-headed arrow 230) is not fixed in any particular direction. The magnetization of the reference layer 222 is however fixed (or pinned) in a certain direction, for example as indicated by the single-headed arrow 232.

The free layer 220 may for example be ferromagnetic, and include for example NiFe, CoFe or CoFeB. The thickness of the free layer 220 may for example be between 5 nm to 10 nm. A diameter of the MTJ 210 may for example be between 100 nm to 2 μm.

The reference layer 222 may for example include a synthetic antiferromagnet (SAF). Examples of SAFs may for example include a multilayer structure of PtMn (or IrMn)/CoFe/Ru/CoFeB. The CoFeB may for example be replaced by another ferromagnet (such as e.g. Ni, Fe, Co or alloys thereof). The Ru may for example be replaced with Cu or a variety of other transition metals. The thicknesses of the reference layer 222 may for example be 2.0 nm $CoFe_{30}$/ 0.7 nm Ru/2.6 nm $CoFe_{40}B_{20}$. As an alternative, it is envisaged that the reference layer 222 for example may include a stacked configuration of a ferromagnetic material and an antiferromagnetic material, wherein the magnetization of the ferromagnetic material is pinned by the antiferromagnetic material due to e.g. exchange coupling and/or exchange bias. In addition to the above SAF configuration, an antiferromagnet may be used to pin the magnetic reference layer 222 in order to improve the field range over which the layer is pinned. The inclusion of the SAF configuration may improve the stability of the magnetic reference layer 222.

The intermediate layer 224 may for example include MgO, or $Al_2O_3$. The intermediate layer 224 may serve as a tunneling barrier through which electrons tunnel to move between the free layer 220 and the reference layer 222. The probability of occurrence of such tunneling may depend on the relative alignment of the magnetizations 230 and 232.

It is also envisaged that the free layer 220, the intermediate layer 224 and the reference layer 222 may include other materials, in addition or instead of the ones listed herein as examples, as long as a magnetic tunnel junction may be formed and, as will be described later herein, the free layer 220 may be configured in a state which has at least one magnetic vortex core.

The free layer 220 may be configured in a state which has at least one magnetic vortex (core). For example, a NiFe free layer 220 may have a magnetic vortex 260 as its ground state.

The at least one magnetic mode of the free layer 220 may contain gyrotropic mode of such a magnetic vortex core. Using a coupling arrangement as described herein with reference to e.g. FIG. 1a or FIG. 1b, the incoming signal may be coupled to the gyrotropic mode via e.g. a magnetic field, and the incoming signal may thereby excite the gyrotropic mode of the magnetic vortex core. When excited by for example an incoming signal (illustrated by the wavy arrow 248), the magnetic vortex 260 may move around within the free layer 220 and follow a certain orbital path 262.

FIG. 2a illustrates schematically the magnetoresistive nano-oscillator (the MTJ) 210 from above. The magnetic free layer 220 has a perimeter 221, and the in-plane orientations of the magnetic moments in the free layer 220 are illustrated by the small, filled arrows. The magnetic state of the free layer 220 in the MTJ 210 includes a magnetic vortex whose central out-of-plane component defines a magnetic vortex core 261. If excited by an incoming signal, via for example a generated magnetic field, the vortex core 261 may oscillate and move around along e.g. the orbital 262. The radius of such an orbital 262 may depend on the frequency of the incoming signal.

If the absolute difference between the frequency of the incoming signal and a resonant frequency of one or more magnetic modes in the free layer 220 is large enough, the radius of the orbital 262 may be small enough such that the vortex core 261 may not reach the perimeter 221 of the free layer 220. In this situation, the vortex core 261 may remain in the free layer 220, as illustrated by the state of the free layer 220 in the MTJ 210 pointed to by the arrow S1. In this state, the magnetization may be non-uniform in for example the y-direction of the plane of the free layer 220, as illustrated by the arrows 264y which represents the mean magnetization in the y-direction in different regions of the free layer 220. This state may partly align with the magnetization of the reference layer 222, and the probability of electrons tunneling through the MTJ 210 may be moderate, giving rise to a moderate MTJ resistance.

If the absolute difference between the frequency of the incoming signal and a resonant frequency of one or more magnetic modes in the free layer 220 is small enough, the radius of the orbital 262 may be large enough such that the vortex core 261 may reach the perimeter 221 of the free layer 220. In this situation, the vortex core 261 may annihilate at the perimeter 221 and be expelled from the free layer 220, as illustrated by the state of the free layer 220 in the MTJ 210' pointed to by the arrow S2. In this state, the magnetization may be uniform (or at least quasi-uniform) and, provided that the magnetization 232 of the reference layer 222 is configured accordingly, either be parallel (align) with the magnetization 232 of the reference layer 222 or be antiparallel (anti-align) with the magnetization 232 of the reference layer 222. If the alignment is parallel, the probability of electrons tunneling across the MTJ 210' may be high. If the alignment is antiparallel, the probability of electrons tunneling across the MTJ 210' may be low. In either case, the tunneling magnetoresistance effect may cause an associated change of resistance across the MTJ between the (quasi-) uniform state and the state still having the vortex. As mentioned earlier herein, this change of resistance may form the basis of a threshold frequency detector.

The resonant frequency of a magnetic mode may be controlled by selecting the materials and dimensions of the MTJ 210 accordingly. Such dimensions may for example include the thickness and diameter, etc.

To provide a frequency sensor which may offer an improvement over such a threshold frequency detector, a frequency sensor (such as the frequency sensor 100 described with reference to FIGS. 1a-1c and including the MTJ 210 described with reference to FIGS. 2a and 2b) according to the present disclosure takes also the probabilistic nature of such annihilation or remaining of the vortex core 261 into account, by performing the plurality of voltage measurements across the magnetoresistive nano-oscillator 110, 210 over time and by determining the frequency of the incoming signal based on a calculated time averaged voltage.

When the absolute difference between the frequency of the incoming signal and one or more magnetic modes in the free layer 220 is large enough, the magnetic vortex core 261 will oscillate without the radius of the orbital 262 being large enough for the vortex core 261 to be expelled. As a result, the magnetization state of the free layer 220 will remain the same. Phrased differently, even though the vortex core 261 may oscillate, the magnetization will remain the same. The free layer 220 will thus behave in a deterministic manner, and there will be little or no probability that the state of the magnetization will change over time.

To the contrary, when the absolute difference between the frequency of the incoming signal and one or more magnetic modes in the free layer 220 is small enough, the radius of the orbital 262 may be large enough for the vortex core 261 to be expelled and renucleated over time. When the vortex core 261 is expelled/renucleated, the magnetization state of the free layer 220 will change, which may reflect in a measured voltage across the MTJ over time. Phrased differently, the free layer 220 will thus behave in a probabilistic manner, and the probability of finding the free layer 220 in the vortex state or in the (quasi-) uniform state will depend on the frequency of the incoming signal.

Figure 3A:
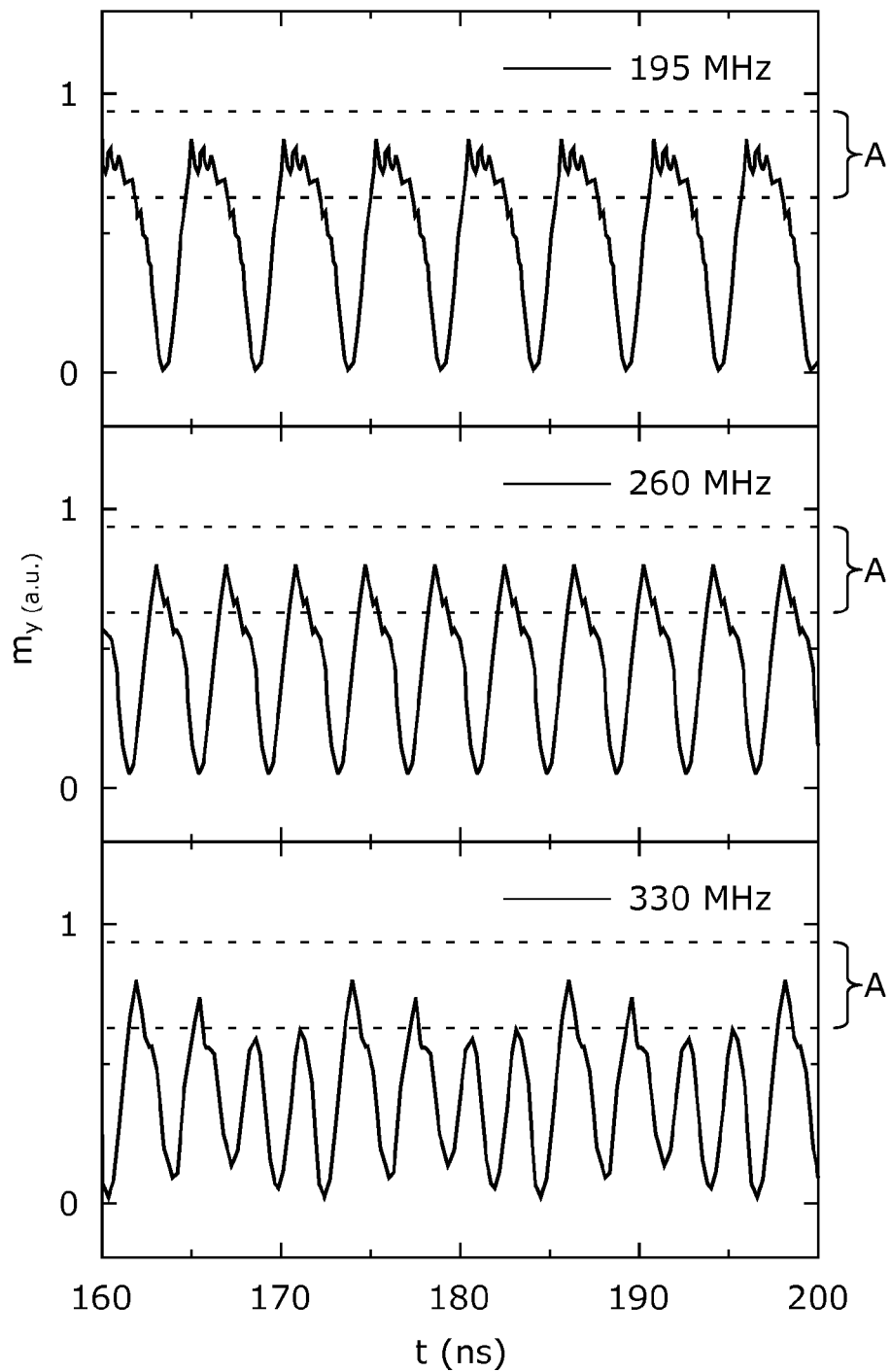
FIGS. 3a-3c illustrate data related to the magnetoresistive nano-oscillator as illustrated in FIGS. 2a-2b.
Figure 3B:
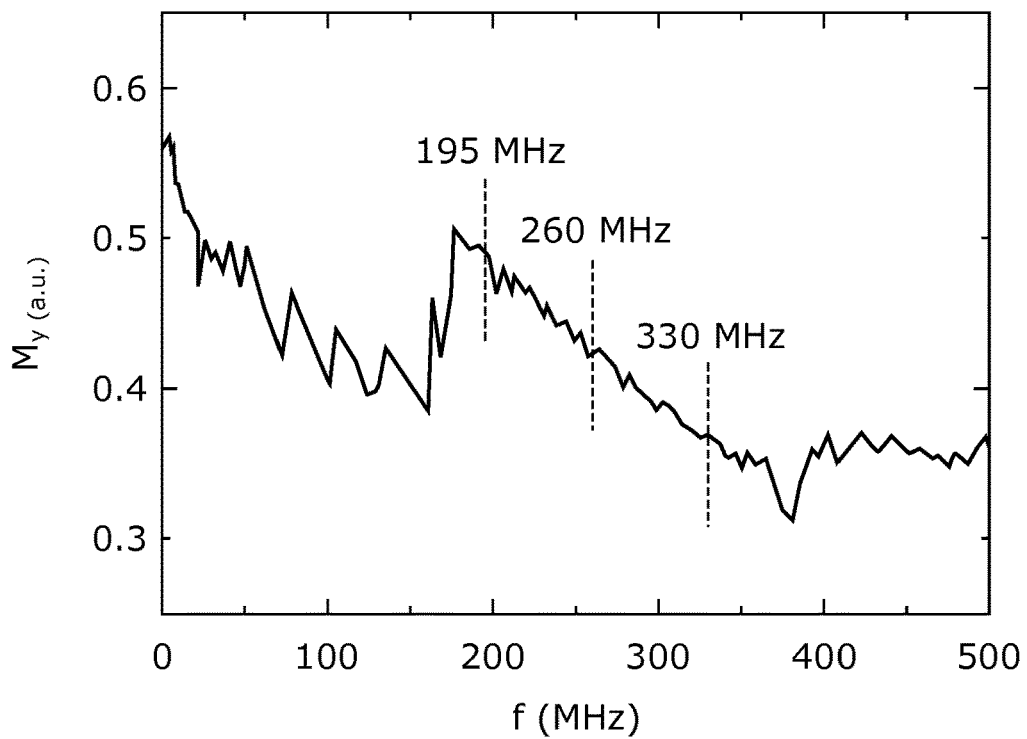
Figure 3C:
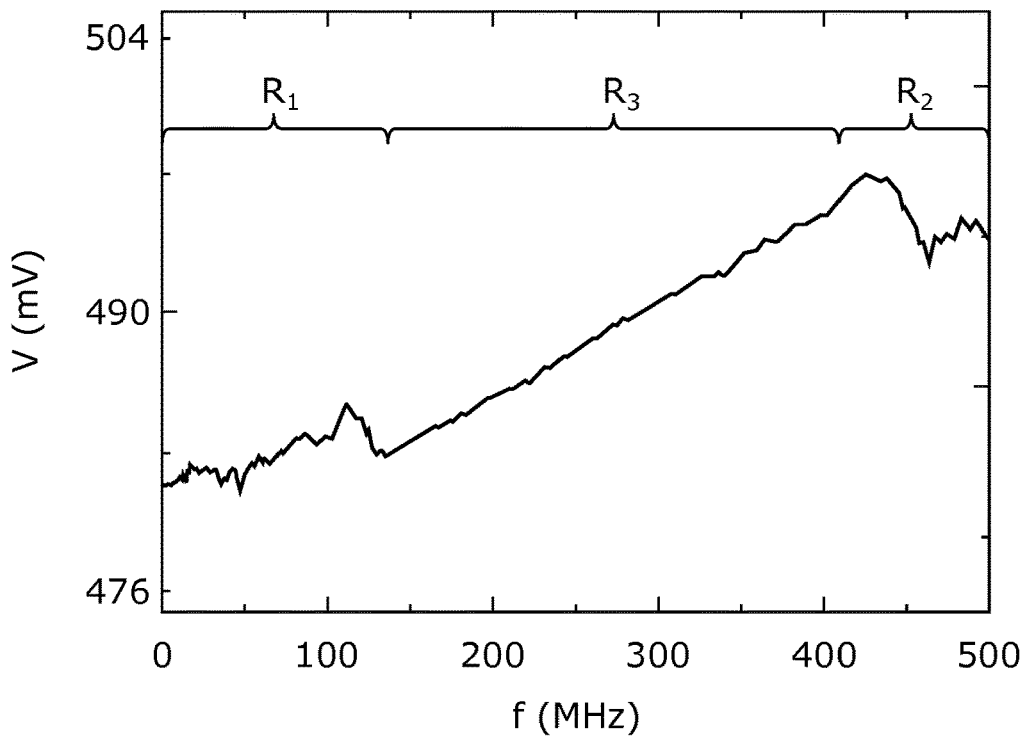

With reference to FIGS. 3a-3c, further details about the operation of the MTJ 210 will now be provided.

FIG. 3a illustrates simulated data on the fluctuating magnetization in the y-direction in the free layer 220 over time. FIG. 3a illustrates such data as a function of time for three different frequencies of the incoming signal, namely when the frequency of the incoming signal is 195 MHz (top plot), 260 MHz (middle plot) and 330 MHz (bottom plot) respectively. In each plot, a region A may be defined in which the vortex core has a large probability of being expelled by coming close enough to the perimeter 221 of the free layer 220.

It may be noted that in the top plot, corresponding to the frequency of the incoming signal being 195 MHz, the curve rather frequently visits the region A. It may further be noted that with increasing frequency (in the middle and bottom plots), the time spent by the corresponding curve within the region A decreases with increasing frequency.

FIG. 3b illustrates the average (in time) magnetization in the y-direction as a function of frequency. Each point in the plot in FIG. 3b corresponds to a time average calculated over a time series of fluctuating magnetization data for the corresponding frequency. Phrased differently, the value of the average magnetization (over time) at the frequency 195 MHz in FIG. 3b has been calculated by performing a time average over the time series shown in the top plot in FIG. 3a. The value of the average magnetization (over time) at the frequency 260 MHz in FIG. 3b has been calculated by performing a time average over the time series shown in the middle plot in FIG. 3a, and so on and so forth for each frequency covered in FIG. 3b. From the figure, it may be noted that between at least 195 MHz to at least 330 MHz, the average magnetization in the y-direction decreases in a linear fashion with increasing frequency. For frequencies around 195 MHz, it may be noted that the magnetic vortex core is expelled quite often, giving rise to a rather (quasi-) uniform average magnetization in the free layer. For frequencies around 330 MHz, it may be noted that the magnetic vortex core is expelled quite seldom, giving rise to a rather non-uniform average magnetization in the free layer. For frequencies in between, such as 260 MHz, it may be noted that the vortex core is expelled more often with decreasing frequencies, and more seldom with increasing frequencies. The average magnetization of the magnetoresistive nano-oscillator along the y direction therefore varies in a linear fashion with respect to frequency. The resistance of the magnetoresistive nano-oscillator, as a consequence, also varies in a linear fashion with respect to frequency. The direction of the "slope" of this linear behavior, i.e. if the resistance increases or decreases with increasing frequency, may depend on the direction of the magnetization of the reference layer.

FIG. 3c illustrates data for time averaged voltages, obtained from the data shown in FIGS. 3a and 3b, for an MTJ wherein the direction of magnetization of the reference layer aligns parallel with the (quasi-)uniform magnetization of the free layer. A positive DC bias current was provided across the MTJ, and it may be noted that the time averaged voltage calculated by the frequency estimator varies in a positive (e.g. with increasing slope) linear fashion as a function of frequency. The different regions discussed earlier herein may be identified in FIG. 3c as the regions $R_1$, $R_2$ and $R_3$. The regions $R_1$ and $R_2$ correspond to first and second deterministic regions. The region $R_3$ corresponds to a probabilistic region, in which the frequency sensor of the present disclosure may estimate the frequency of the incoming signal as a one-to-one function of the time averaged voltage. In the example shown in FIGS. 3a to 3c, the one-to-one function resembles a linear function in the region $R_3$, and the frequency sensor may for example estimate the frequency of the incoming signal in this region as directly proportional to the time averaged voltage. The proportionality constant and an offset constant (if needed) may for example be determined from FIG. 3c.

Figure 4:
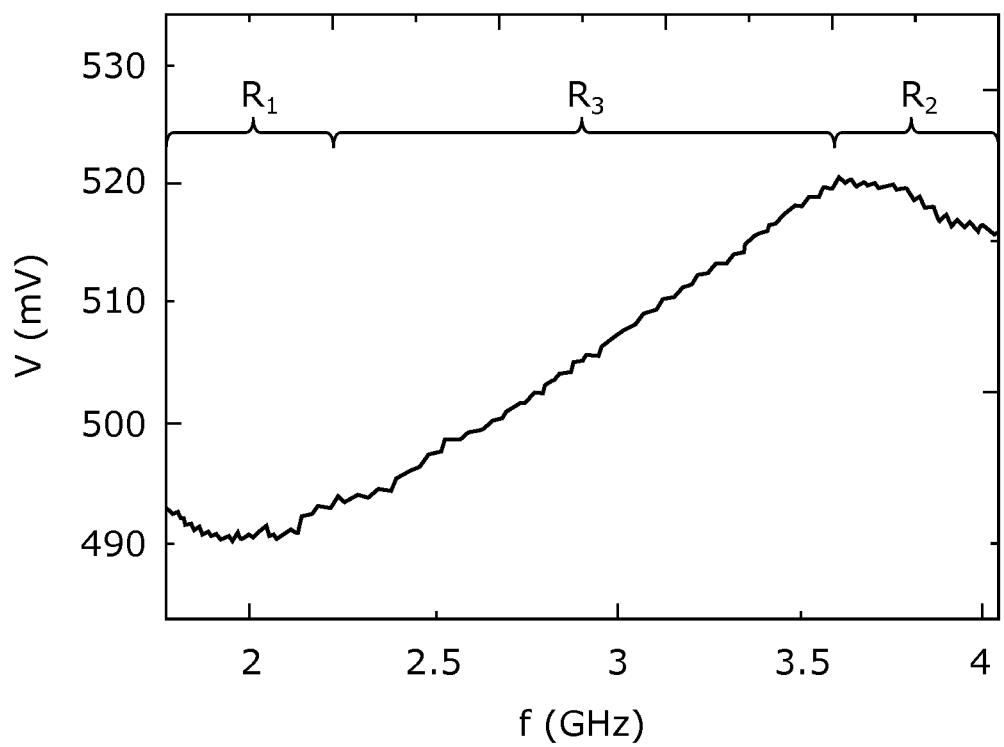
FIG. 4 illustrates data related to embodiments of a magnetoresistive nano-oscillator of a frequency sensor according to the present disclosure.

With reference to FIG. 4, data for a further embodiment of a magnetoresistive nano-oscillator in a frequency sensor according to the present disclosure is provided.

Instead of coupling directly to the gyroscopic mode of the magnetic vortex core, the incoming signal may couple indirectly to the gyroscopic mode by exiting one or more higher order (azimuthal spin wave) modes, which themselves are coupled to the gyrotropic mode. This indirect excitation of the gyrotropic mode may allow e.g. the upper frequency above which the frequency sensor is less useable to be increased. FIG. 4 illustrates data of time averaged voltage versus frequency for such coupling, and it may be noted that the probabilistic region $R_3$ now extends from approximately 2 GHz up to 3.5 GHz. By exciting even higher modes (which indirectly couples to the gyrotropic mode), it is envisaged that even higher frequencies may be sensed by the frequency sensor, such as for example frequencies exceeding 10 GHz or more. FIG. 4 corresponds to an MTJ having a diameter of around 200 nm, an applied DC biasing current of around 7 mA, an applied magnetic field of around 400 mT, and a field line corresponding to around 10 dBm.

Figure 5A:
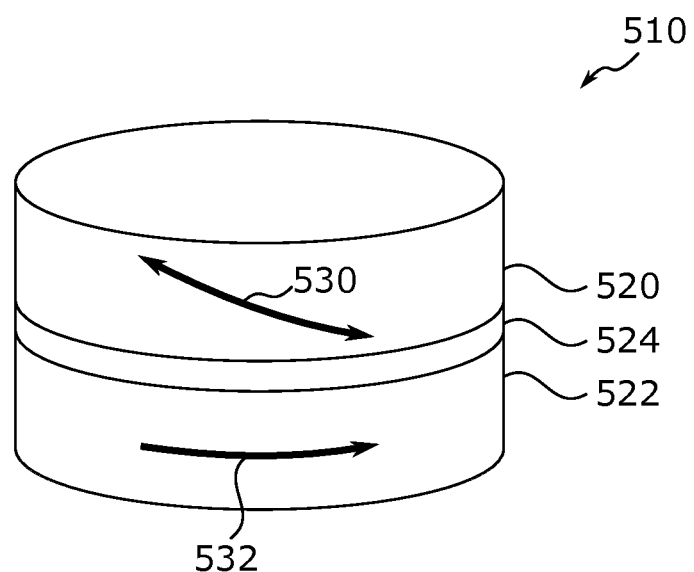
FIG. 5a illustrates schematically embodiments of a magnetoresistive nano-oscillator of a frequency sensor according to the present disclosure.
Figure 5B:
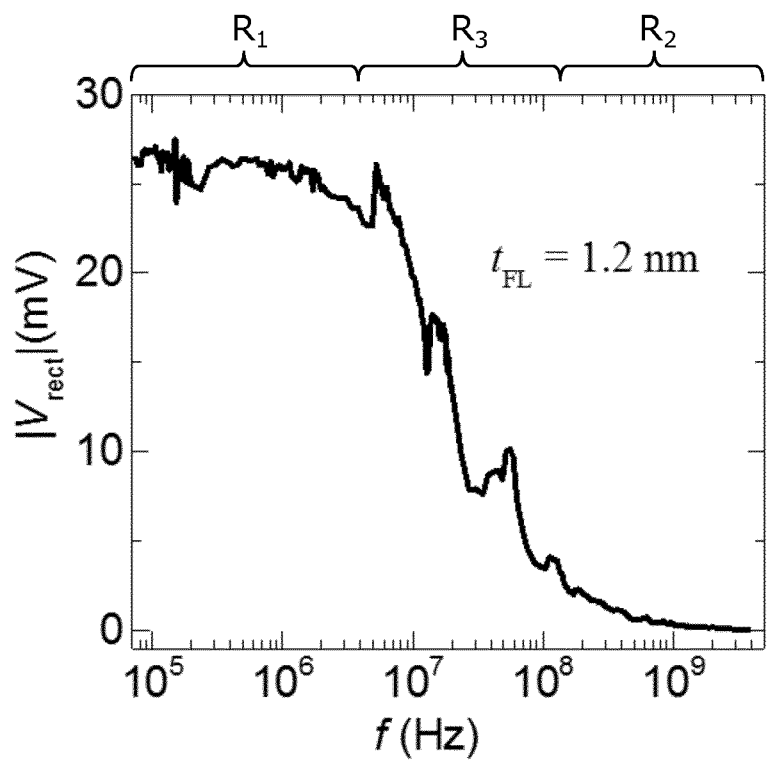

With reference to FIGS. 5a and 5b, one embodiment of a magnetoresistive nano-oscillator of a frequency sensor according to the present disclosure, and data related thereto, will now be described in more detail.

FIG. 5a illustrates a magnetoresistive nano-oscillator 510 which may be used for example as the magnetoresistive nano-oscillator 110 of the frequency sensor 100 described with reference to FIGS. 1a and 1c. The magnetoresistive nano-oscillator 510 is a magnetic tunnel junction (MTJ) and includes a magnetic free layer 520, a magnetic reference layer 522 and a non-magnetic intermediate layer 524. The intermediate layer 524 is arranged between the free layer 520 and the reference layer 522.

The magnetization of the free layer 520 is uniform but tilted out of the plane of the MTJ due to a surface anisotropy between an interface between the intermediate layer 524 and the free layer 520. The magnetization of the free layer 520 (illustrated by the double-headed arrow 530) is not pinned or fixed in any certain direction, and may be influenced by e.g. a current through the magnetoresistive nano-oscillator such that the relative proportion and orientation of the magnetization along the plane of the reference layer 522 is altered. The magnetization of the reference layer 522 is, like described earlier herein, fixed (or pinned) in a certain direction. The magnetization of the reference layer 522 is illustrated by the single-headed arrow 532.

The free layer 520 may for example include CoFeB. The intermediate 524 layer may for example include MgO. The reference layer 522 may for example be a synthetic antiferromagnet (SAF). Examples of SAFs may for example include a multilayer structure of PtMn (or IrMn)/CoFe/Ru/CoFeB.

The magnetoresistive nano-oscillator 510 may be provided in form of a nano-pillar. A diameter of such a pillar may for example be between 50 nm to 200 nm. A thickness of the magnetic free layer 524 may for example be around 1 nm.

The incoming signal may be passed through the magnetoresistive nano-oscillator 510 as a current, thereby coupling the incoming signal to at least one magnetic mode of the magnetoresistive nano-oscillator 510 and the free layer 520. The signal may be coupled using for example the coupling arrangement 140 as described with reference to FIGS. 1a and 1c.

As described earlier herein, the magnetization of the free layer 520 may be modulated by the current of the incoming signal. The modulated/oscillating magnetization may give rise to an oscillating resistance across the magnetoresistive nano-oscillator 510. Combined with the oscillating current from the incoming signal, a rectified voltage may be caused across the magnetoresistive nano-oscillator 510. The frequency estimator (such as the frequency estimator 150 described with reference to e.g. FIG. 1a) may perform a plurality of measurements of this rectified voltage over time, calculate a time averaged voltage, and estimate the frequency of the incoming signal based on this calculated time averaged voltage. In this embodiment, voltage across the magnetoresistive nano-oscillator may be measured without any DC bias current. The voltage across the magnetoresistive nano-oscillator may depend on whether the magnetoresistive nano-oscillator is locked to the incoming (modulating) signal or not. The probability of locking, which may be extracted through the time averaged voltage, may depend on the frequency of the incoming signal. The frequency estimator may therefore estimate the frequency of the incoming signal by calculating the time averaged (rectified) voltage.

FIG. 5b illustrates data for the magnetoresistive nano-oscillator 510. In FIG. 5b, the rectified voltage is plotted as a function of frequency of the incoming signal. The frequency is plotted using a logarithmic scale. From the figure, it may be noted that the three regions (the first and second deterministic regions $R_1$ and $R_2$, and the probabilistic region $R_3$) are still present, but that the time averaged (rectified) voltage now depends logarithmically on the frequency in the probabilistic region $R_3$. A logarithmic dependence still allows the frequency sensor of the present disclosure to estimate the frequency of the incoming signal as a one-to-one function of the time averaged voltage.

Figure 6:
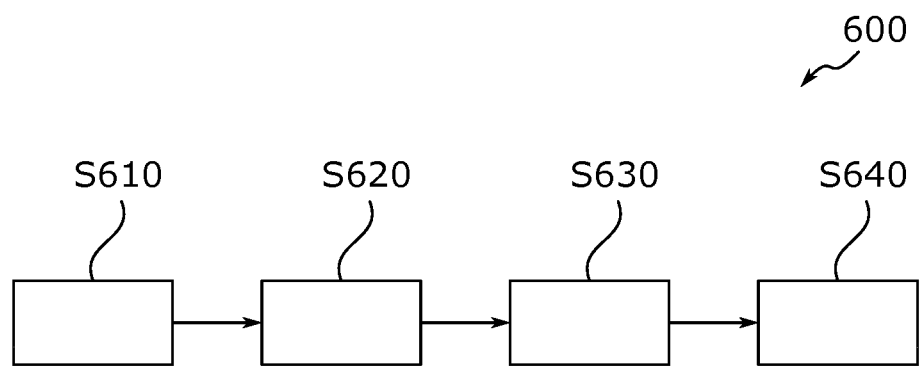
FIG. 6 illustrates schematically a flowchart of an embodiment of a method according to the present disclosure.

With reference to FIG. 6, a method of estimating the frequency of an incoming signal according to the present disclosure will now be described.

FIG. 6 illustrates schematically a flowchart of a method 600. In a step S610, the incoming signal is coupled to at least one magnetic mode of a free magnetic layer. The free magnetic layer forms part of a magnetoresistive nano-oscillator including a magnetic heterostructure of at least the magnetic free layer, a magnetic reference layer and a non-magnetic intermediate layer. The non-magnetic intermediate layer is arranged between the magnetic free layer and the magnetic reference layer. The magnetoresistive nano-oscillator may for example correspond to the MTJ 210 described with reference to FIG. 2a, or the MTJ 510 described with reference to FIG. 5a.

In a step S620, a plurality of voltage measurements across the magnetoresistive nano-oscillator are performed over time.

In a step S630, a time averaged voltage across the magnetoresistive nano-oscillator is calculated based on the plurality of voltage measurements obtained in step S620.

In a step S640, a frequency of the incoming signal is estimated based on the calculated time averaged voltage obtained in step S530. The frequency is estimated over a finite range of frequencies, i.e. multiple frequencies may be estimated using the same magnetoresistive nano-oscillator/device.

The method 600 may include also other steps, or modifications of the steps S610 to S640, in accordance with what has already been described herein with reference to the embodiments of the frequency sensor according to the present disclosure.

By using a magnetoresistive nano-oscillator, and by performing a plurality of voltage measurements across the magnetoresistive nano-oscillator over time in order to calculate a time averaged voltage across the magnetoresistive nano-oscillator, the inventors have provided an improved frequency sensor. The improved frequency sensor may sense the frequency of an incoming signal over a broader interval, using a single magnetoresistive nano-oscillator/device. Frequencies may be sensed from a few tens of MHz up to several GHz, without the need of complicated and bulky filter banks or multiple devices/detectors connected and operated together. This provides an improvement both in terms of sensing capability, bulk size and production cost.

As the inventors have realized, a frequency sensor such as e.g. described herein in embodiments wherein the magnetic mode includes a gyrotropic mode of the magnetic vortex core, may also be constructed/described using on a more general mechanism. Examples will be described below with reference to FIG. 7.

The magnetic free layer of the MTJ may have different possible states. These states may depend upon geometry, interface effects, or for example on the materials used when constructing the MTJ. These states may include, but is not limited to, e.g. magnetic vortices, magnetic skyrmions, magnetic bubbles, and quasi-uniform magnetic states (whose magnetization direction may be in the plane of the junction or out-of-plane of the junction).

Figure 7:
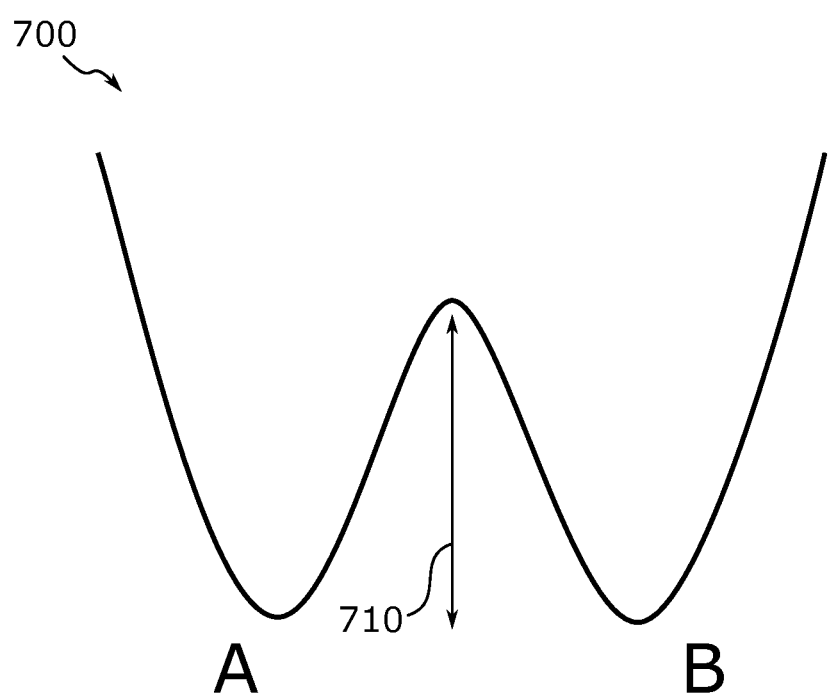
FIG. 7 illustrates schematically a general concept of magnetic states of a frequency sensor according to the present disclosure.

The state of free layer may therefore be switched between multiple magnetic states. The multiple magnetic states may be separated by an energy barrier. It may be appreciated that a frequency sensor according to the present disclosure may require e.g. two available magnetic states which have roughly/approximately equivalent energy levels, and that these magnetic states may be separated by a relatively small energy barrier. FIG. 7 illustrates schematically the energy 700 of two such magnetic states A and B, separated by an energy barrier 710.

Another requirement for a frequency sensor according to the present disclosure may be a frequency dependent coupling mechanism, such as discussed earlier herein, which may correspond to an excitation mechanism required to overcome the energy barrier 710 in order to move between the magnetic states A and B. Phrased differently, the frequency dependent coupling may induce a transition between the magnetic states, i.e. there may be an excitation which allows for a transition over the barrier.

Simple switching mechanisms which allow the switching from e.g. state A to state B are known and used for example in magnetic memories using spin-transfer torque (e.g. STT MRAMs) or in frequency detectors as discussed earlier herein (see e.g. Jenkins S et al., "Spin torque resonant vortex core expulsion for an efficient radio-frequency detection scheme", DOI: 10.1038/NNANO.2015.295). To the contrary, in a frequency sensor according to the present disclosure, the switching mechanism involves more than a single transition between a pseudo-static magnetic state A to a pseudo-magnetic state B. Instead, a frequency sensor according to the present disclosure provides and relies upon a continuous dynamic transition between magnetic state A and magnetic state B. The relative time spend in either magnetic state A or magnetic state B depends on the frequency via the provided coupling mechanism.

Using one of the embodiments using gyrotropic modes described earlier herein as an example, magnetic state A may for example correspond to the magnetic vortex, and magnetic state B may for example correspond to the quasi-uniform state. The coupling mechanism may be the excitation of the gyrotropic (and spin wave mode) via a localized magnetic field generated by a radiofrequency current passing through an integrated antenna (i.e. the at least one field line adjacent to the MTJ for passing the incoming signal through as current to generate a magnetic field).

Other embodiments are also envisaged, including for example continuous nucleation and annihilation of a magnetic skyrmion upon the excitation of a resonant mode of the skyrmion (e.g. a gyrotropic/breathing mode). In such a configuration, an amount of time that the skyrmion is stable for would be frequency dependent as the frequency approaches the resonant mode of the skyrmion. An embodiment using such a skyrmion configuration may for example use the same material structure as described earlier herein, e.g. as described according to the first aspect of the frequency sensor of the present disclosure. It may be envisaged also to further improve upon the functioning of such a skyrmion-based frequency sensor by including an additional capping layer comprising a heavy element (such as e.g. Pd or Ta) to improve upon the formation of skyrmions.

A further envisaged embodiment may e.g. include a transition between two quasi-uniform magnetic states in the free layer which correspond, respectively, to being either parallel or anti-parallel to the reference layer. Although the energy barrier between such two states may normally be large (e.g. as used in MRAM applications) they can be designed to have a small energy barrier by using e.g. superparamagnets and/or by decreasing the geometry. Such a small barrier may then be overcome by the application of the frequency dependent coupling mechanism of the present disclosure. Phrased differently, it is envisaged that a low enough energy barrier may be achieved by system design.

Although features and elements are described above in particular combinations, each feature or element may be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A frequency sensor, comprising:
magnetoresistive nano-oscillator including a magnetic heterostructure of at least a magnetic free layer, a magnetic reference layer and a non-magnetic intermediate layer arranged between the magnetic free layer and the magnetic reference layer;
a coupling arrangement arranged to couple an incoming signal to at least one magnetic mode of said magnetic free layer, and
a frequency estimator configured to:
perform a plurality of voltage measurements across said magnetoresistive nano-oscillator over time;
calculate, based on said plurality of voltage measurements, a time averaged voltage across said magnetoresistive nano-oscillator;
estimate, over a finite range of frequencies, a frequency of the incoming signal as a one-to-one function of the calculated time averaged voltage, and
output a signal representative of said estimated frequency.

2. The frequency sensor of claim 1,
wherein the magnetoresistive nano-oscillator is a magnetic tunnel junction, MTJ;
wherein the magnetic free layer is configurable in a state having at least one magnetic vortex core;
wherein the at least one magnetic mode includes a gyrotropic mode of the magnetic vortex core, and
wherein the coupling arrangement comprises at least one field line adjacent to the MTJ for passing the incoming signal through as current to generate a magnetic field, said magnetic field being usable to excite said at least one gyrotropic mode of the magnetic vortex core using the incoming signal.

3. The frequency sensor of claim 2, wherein the frequency estimator is configured to perform the voltage measurements over a time interval spanning several oscillations of said at least one magnetic vortex core.

4. The frequency sensor of claim 2, wherein the at least one magnetic mode includes an azimuthal spin wave mode, and wherein the gyrotropic mode of the magnetic vortex core is excited indirectly through said azimuthal spin wave mode.

5. The frequency sensor of claim 1,
wherein the magnetoresistive nano-oscillator is a magnetic tunnel junction, MTJ, and
wherein the coupling arrangement comprises at least one conductor for passing the incoming signal as current through the MTJ to modulate a magnetization in the magnetic free layer.

6. The frequency sensor of claim 5, wherein a magnetization of the magnetic free layer is tilted out of the plane of the MTJ.

7. The frequency sensor of claim 5, wherein the frequency estimator is configured to perform the voltage measurements over a time interval spanning several periods of the incoming signal.

8. The frequency sensor of claim 3, wherein the frequency estimator is configured to determine a required length of the time interval based on a desired resolution of the determined frequency of the incoming signal.

9. The frequency sensor of claim 1, wherein the frequency estimator is configured to measure the voltage across said magnetoresistive nano-oscillator as a rectified voltage.

10. The frequency sensor of claim 1, further comprising a biasing arrangement for providing a biasing DC current through the magnetoresistive nano-oscillator.

11. The frequency sensor of claim 1, wherein the magnetoresistive nano-oscillator is provided in the form of a nanopillar.

12. A method of estimating a frequency of an incoming signal, comprising:
   coupling the incoming signal to at least one magnetic mode of a free magnetic layer, the free magnetic layer forming part of a magnetoresistive nano-oscillator including a magnetic heterostructure of at least the magnetic free layer, a magnetic reference layer and a non-magnetic intermediate layer arranged between the magnetic free layer and the magnetic reference layer;
   performing a plurality of voltage measurements across the magnetoresistive nano-oscillator over time;
   calculating, based on the plurality of voltage measurements, a time averaged voltage across the magnetoresistive nano-oscillator, and
   estimating, over a finite range of frequencies, a frequency of the incoming signal as a one-to-one function of the calculated time averaged voltage.

13. The method of claim 12, wherein the magnetoresistive nano-oscillator is a magnetic tunnel junction, MTJ, and wherein the method comprises:
   configuring the magnetic free layer in a state having at least one magnetic vortex core, such that the at least one magnetic mode includes a gyrotropic mode of the magnetic vortex core, and
   passing the incoming signal as a current through at least one field line adjacent to the MTJ to generate a magnetic field, thereby coupling the incoming signal to the at least one magnetic mode.

14. The method of claim 12, wherein the magnetoresistive nano-oscillator is a magnetic tunnel junction, MTJ, and wherein the method comprises:
   coupling the incoming signal to the at least one magnetic mode by passing the incoming signal as a current through the MTJ.

15. The method of claim 14, further comprising tilting a magnetization of the magnetic free layer out of the plane of the MTJ.

* * * * *